(12) United States Patent
Amick et al.

(10) Patent No.: US 6,429,722 B1
(45) Date of Patent: *Aug. 6, 2002

(54) CLOCK NOISE REDUCTION METHOD

(75) Inventors: Brian W. Amick, Sunnyvale; Claude R. Gauthier, Fremont, both of CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/846,757

(22) Filed: May 1, 2001

(51) Int. Cl.[7] .............................................. H03K 17/16

(52) U.S. Cl. ......................... 327/379; 327/386; 327/387

(58) Field of Search ................................ 327/379, 384, 327/386, 387, 212, 24, 170

(56) References Cited

U.S. PATENT DOCUMENTS

| | | | | | |
|---|---|---|---|---|---|
| 4,370,620 | A | * | 1/1983 | Tin | 329/347 |
| 4,672,325 | A | * | 6/1987 | Murai | 327/135 |
| 5,164,611 | A | * | 11/1992 | Summe | 327/170 |
| 5,311,077 | A | * | 5/1994 | Brown | 326/21 |
| 5,539,337 | A | | 7/1996 | Taylor et al. | 326/94 |
| 5,754,068 | A | * | 5/1998 | Kumagai | 327/142 |

* cited by examiner

Primary Examiner—Kenneth B. Wells
Assistant Examiner—Cassandra Cox
(74) Attorney, Agent, or Firm—Rosenthal & Osha L.L.P.

(57) ABSTRACT

A method of reducing the noise of a clock signal distribution system for a flip-flop based circuit has been develop. The method first inputs a synchronized clock signal into a noise reduction circuit. The noise reduction circuit then begins to store charge upon receipt of the clock signal. Finally, the noise reduction circuit dumps the charge onto the system power grid at an appropriate time in conjunction with the clock signal.

18 Claims, 10 Drawing Sheets

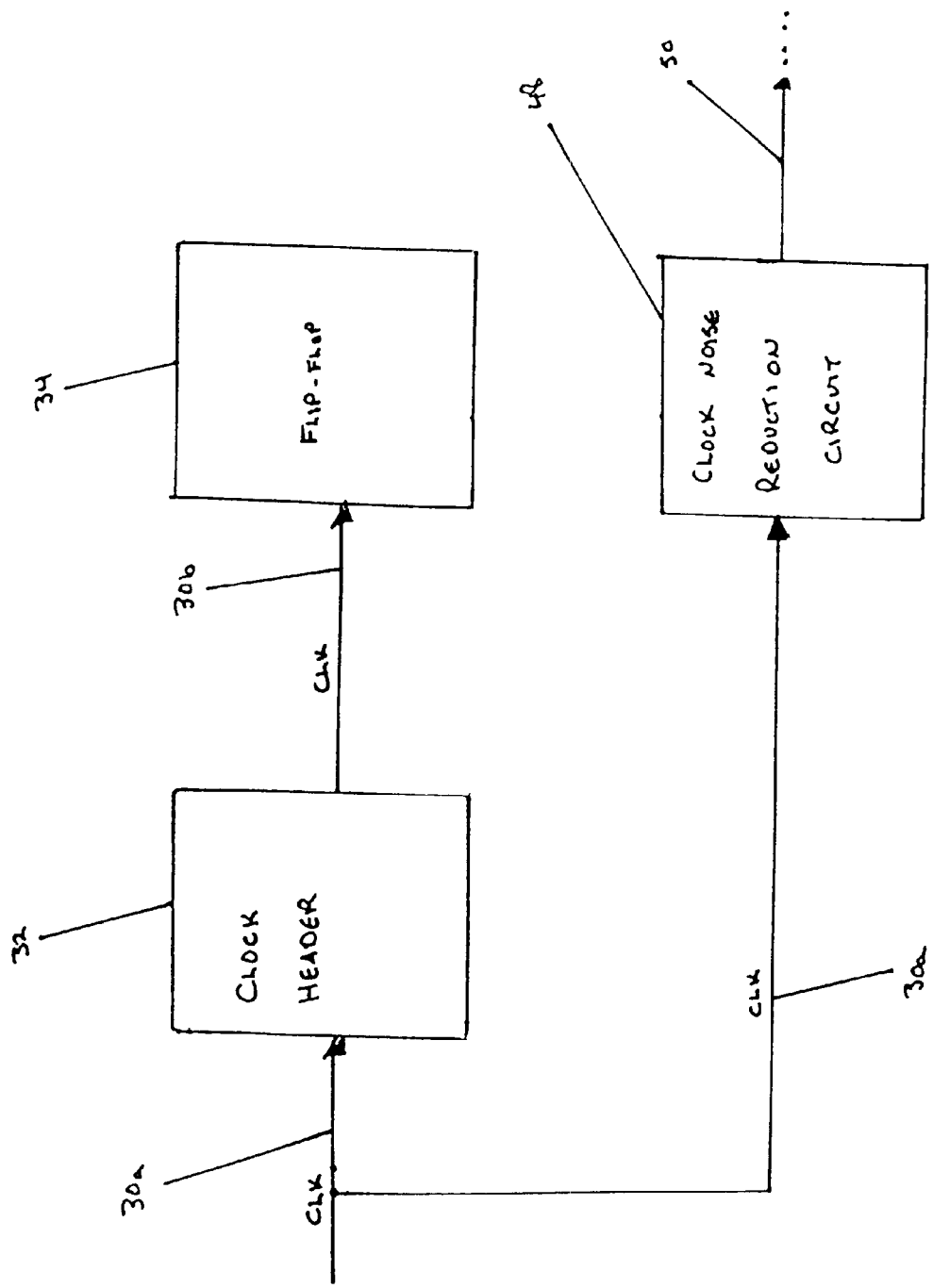

CLOCK NOISE REDUCTION METHOD

BACKGROUND OF INVENTION

1. Field of the Invention

The invention relates generally to electronic circuitry. More specifically, the invention relates a method for reducing the noise associated with a clock signal in a flip-flop based circuit.

2. Background Art

In all microprocessor-based systems, including computers, the clock circuit is a critical component. The clock circuit generates a clock signal that is a steady stream of timing pulses that synchronize and control the timing of every operation of the system. FIG. 1 shows a prior art diagram of an ideal clock signal 10. An entire clock cycle 12 includes a rising or leading edge 14 and a falling or trailing edge 16. These edges 14, 16 define the transition between the low and high value of the signal.

FIG. 2 shows a block diagram of a prior art local clock signal distribution system. The clock signal 30a is input to a clock header 32 which serves to buffer the clock signal. From the header 32, the clock signal 30b is input to an edge-triggered flip flop 34 ("flip-flop") where it serves to trigger the flip-flop. A flip-flop is a memory device that is commonly used in integrated circuits. It is dependent upon a clock signal to initiate its function. Flip-flops generally take input data and distribute output data on the rising edge of a clock signal. However, a flip-flop could be configured to work on the falling edge of a clock signal.

FIG. 3 shows a digital logic schematic of the prior art local clock signal distribution system as shown in FIG. 2. The clock signal 30a is input to the clock header 32. The clock header 32 includes a NAND gate 36 and an inverter 38a. Once inside the clock header 32, the clock signal 30a is one of the inputs to the NAND gate 36. The other NAND input 42 is a signal that is HIGH so that the gate 36 simply inverts the value of the clock signal 30a. The NAND input 42 is switched to LOW to turn off the clock header 32 if needed. Next, the signal 30a passes through the inverter 38a which inverts the signal back to its original value. The clock signal 30b then passes from the clock header 32 to the flip-flop 34. Once in the flip-flop 34, the signal 30b is split into two paths. The first path passes through one inverter 38b, and the second path passes through two consecutive inverters 38c and 38d. Each path feeds into the internal circuitry of the flip-flop 40 along with the DATA_IN 44 and DATA_OUT 46 paths of the flip-flop 34.

Clock noise problems on the system power grid are usually caused by the large amount of current that is used in clock signal distribution. This current comes from the switching transistors that control the clock signal. As these transistors switch states, the current noise spikes onto the power grid due to the current demand or "current draw"of the switching transistors. These high current demands cause noise in the system voltage supply due to voltage (IR) drops and inherent system inductance (L di/dt). A clock signal distribution circuit uses a significant amount of current in a short amount of time because the spikes occur twice per clock cycle: once on the current draw of the leading edge and once on the current draw of the falling edge of the signal. This puts the noise at a very high frequency (2×the clock frequency). This noise can cause missed timing if the clock signal voltage is too low or component failure if the clock signal voltage is too high. The noise can even escape "off the chip" and affect the other components of the system.

FIG. 4 shows a graph of current draw during a clock cycle period of the prior art embodiment shown in FIG. 3. The flip-flop of this embodiment is triggered on the rising edge of a clock signal. The value "I" 35 represents the full value of a current draw. The value "¾ I" 37 represents 75% of the full value while the value "½ I" 39 represents 50% of the full value. The first current draw 41 of the graph represents the draw that results from the leading edge of a clock cycle (at clock cycle=0). The second current draw 43 represents the draw that results from the falling edge of the clock cycle (at clock cycle=t/2). As shown, the leading edge draw 41 is the full value of current draw. The trailing edge draw 43 is about half the value of the leading edge draw 41. In this example, the first draw 41 is larger than the second draw 43 because all of the flip-flop's change on the rising edge of the clock signal. Since none of the flip-flops change on the falling edge, the second draw 43 is smaller.

A common technique to alleviate noise is adding additional power to the grid. This power is added upon sensing a voltage drop due to noise. However, such techniques only respond to noise at a much lower frequency than clock noise and also respond only to a certain threshold of noise. Consequently, a need exists for a technique that generates a response to clock noise at a synchronized frequency with the clock noise itself.

SUMMARY OF INVENTION

In some aspects, the invention relates to an apparatus for reducing noise of a clock signal for a flip-flop based circuit, comprising: a charge control circuit that initiates storing a charge upon receipt of a first pre-determined signal; and a dump control circuit that initiates dumping the charge onto a system power grid upon receipt of a second predetermined signal.

In another aspect, the invention relates to an apparatus for reducing the noise of a clock signal for a flip-flop based circuit, comprising: means for initiating a charge control circuit that stores a charge upon receipt of a first pre-determined signal; and means for initiating a dump control circuit that dumps the charge onto a system power grid upon receipt of a second pre-determined signal.

Other aspects and advantages of the invention will be apparent from the following description and the appended claims.

DETAILED DESCRIPTION

Figure 1:
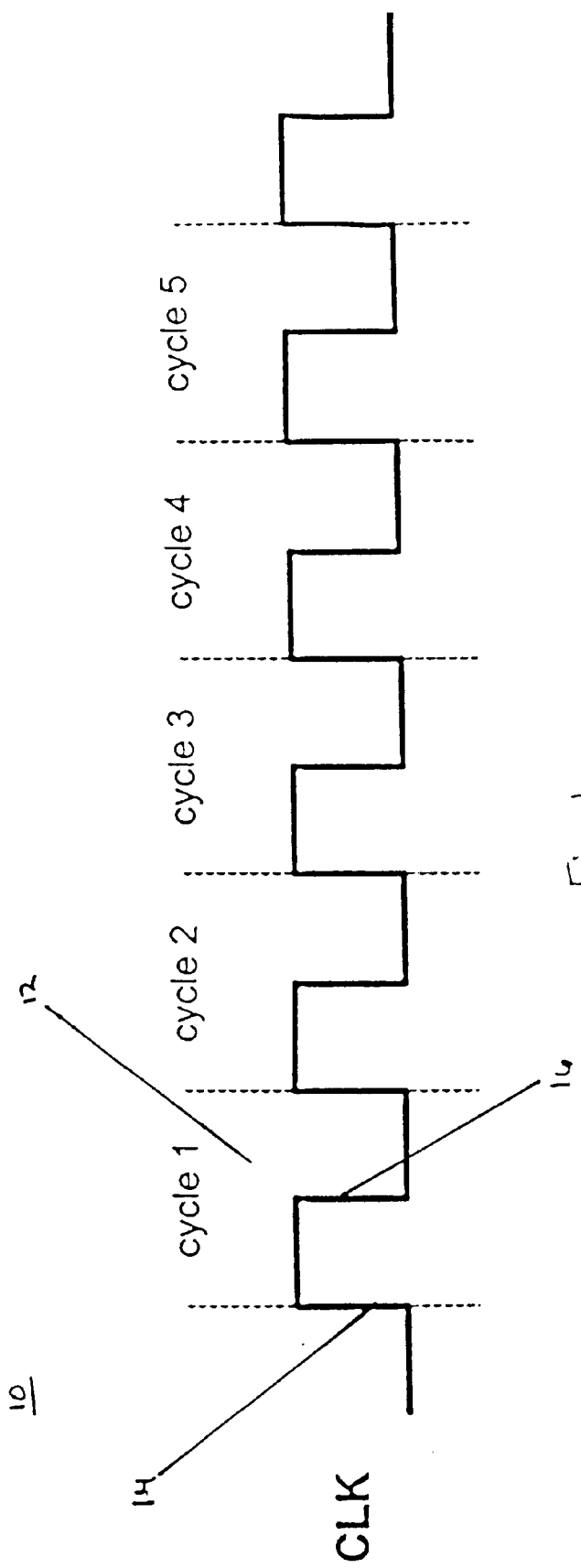
FIG. 1 shows a graph of an ideal clock signal.

Exemplary embodiments of the invention will be described with reference the accompanying drawings. Like items in the drawings are shown with the same reference numbers.

Figure 2:
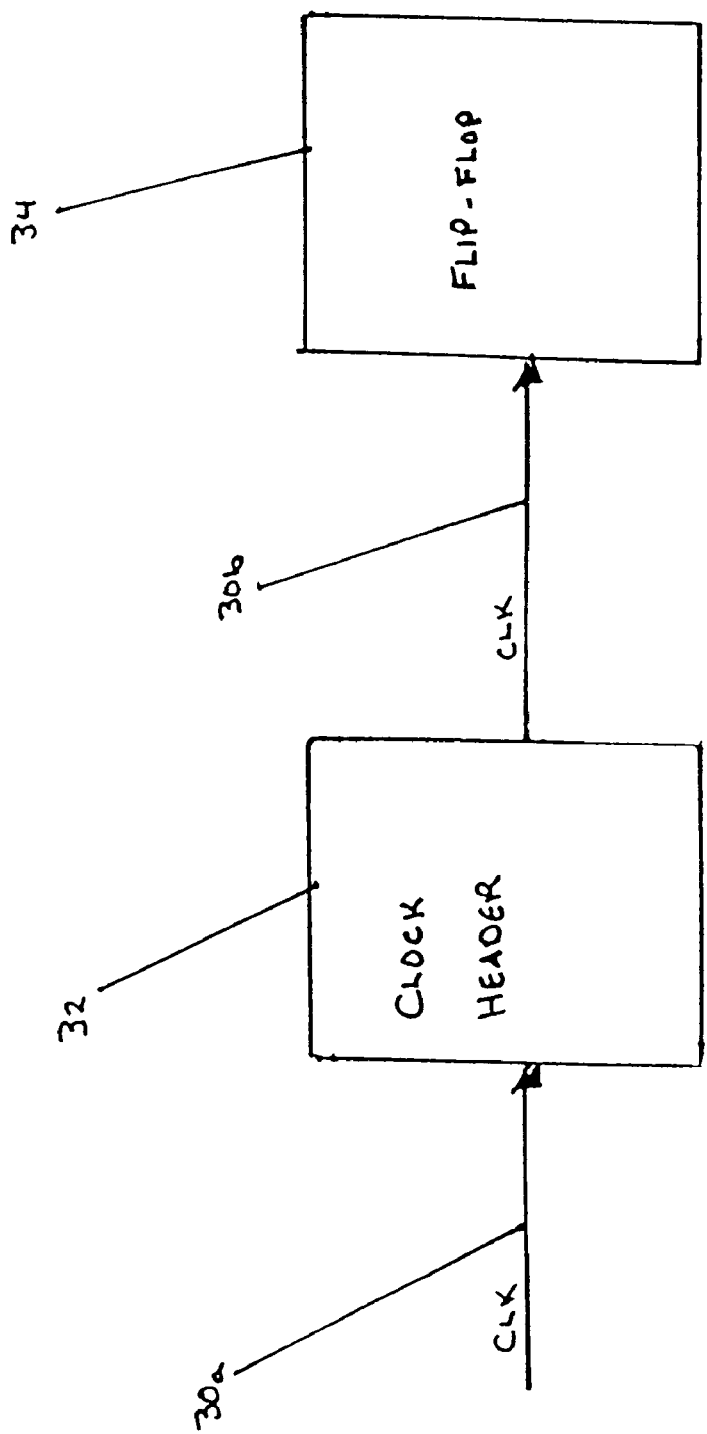
FIG. 2 shows a block diagram of a prior art embodiment of a clocking circuit for a flip-flop.
Figure 5:
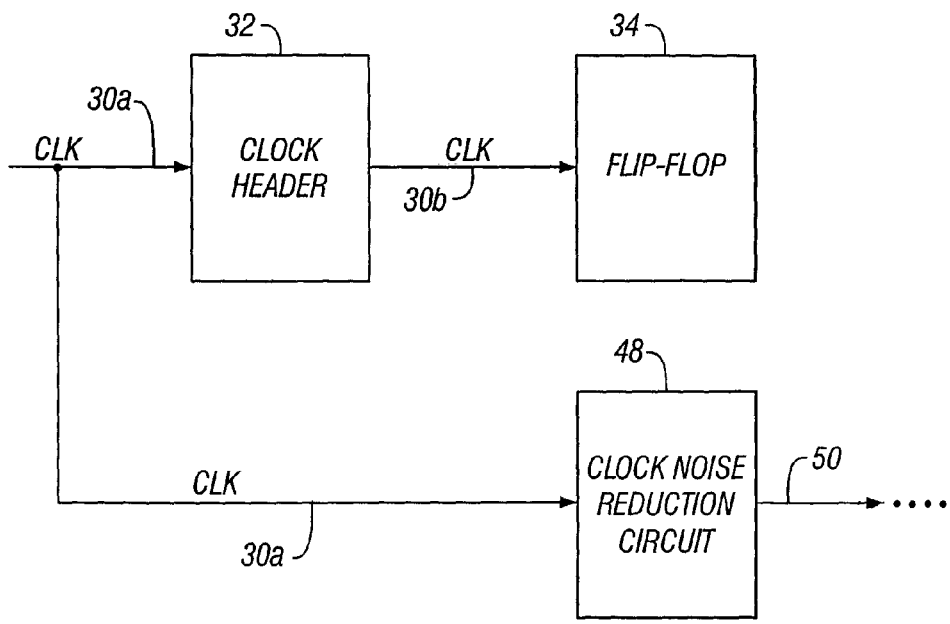
FIG. 5 shows a block diagram of a block diagram of one embodiment of the present invention.
Figure 8:
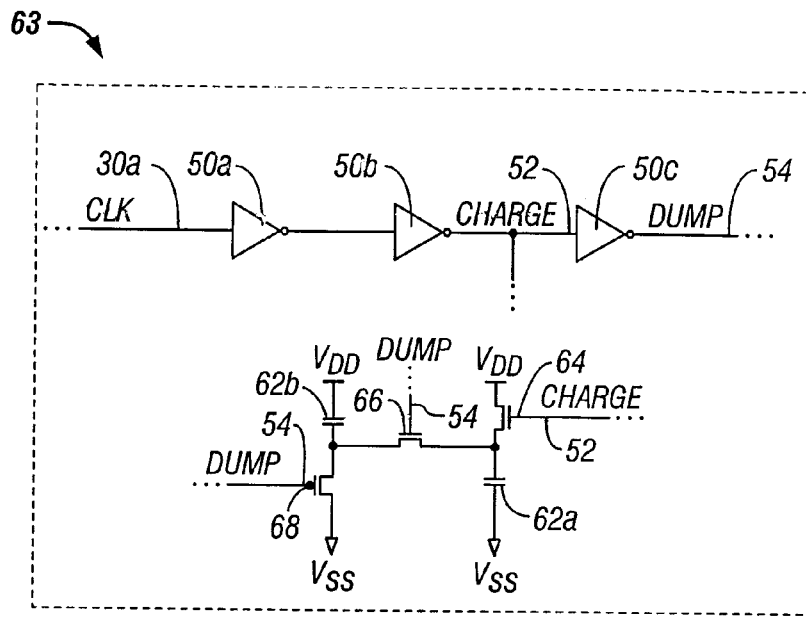
Figure 9:
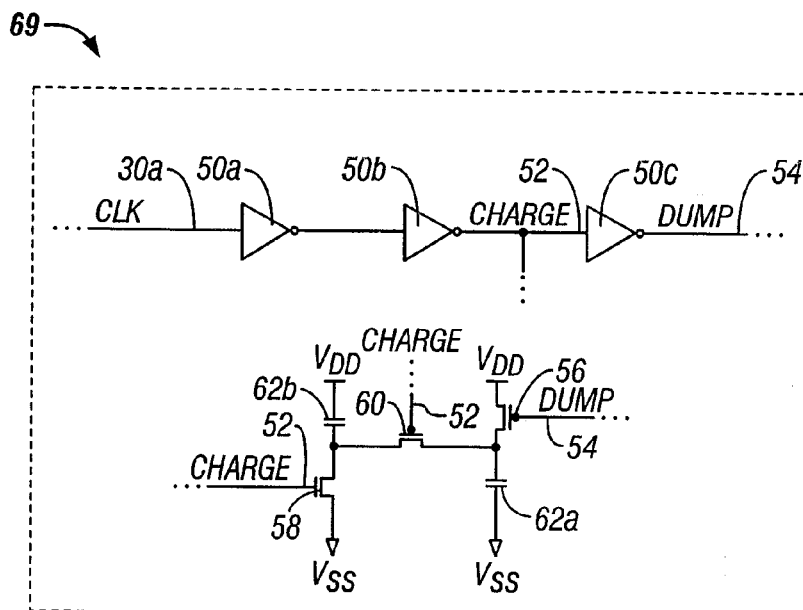
Figure 10:
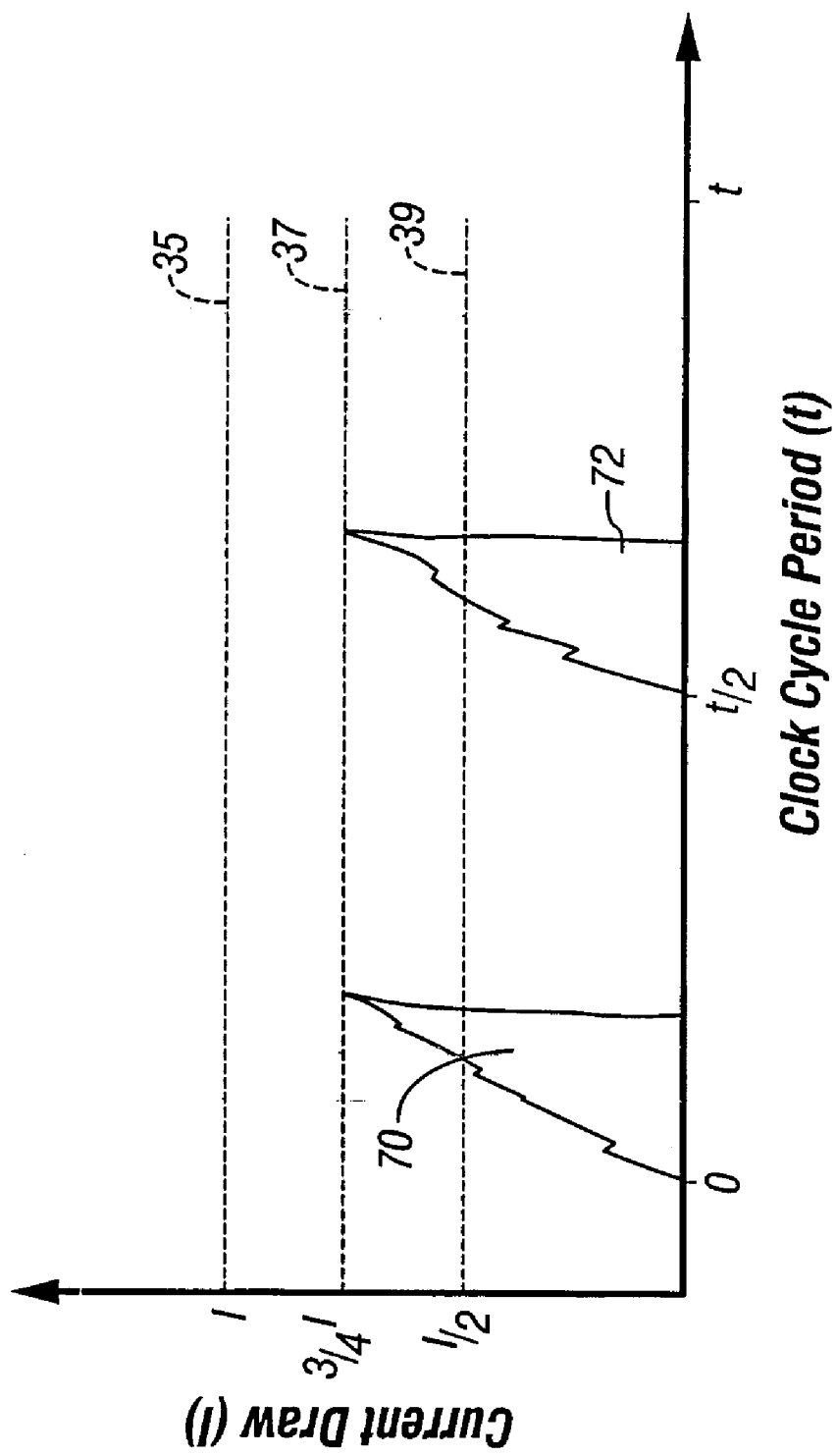

FIG. 5 shows a block diagram of a local clock signal distribution system similar to that shown in FIG. 2) with a clock noise reduction circuit 48 added in accordance with one embodiment of the present invention. The clock signal 30a is input to a clock header 32 which serves to buffer the clock signal. From the header 32, the clock signal 30b is input to a flip-flop 34 where it serves to trigger the device. In this embodiment of the present invention, the initial clock signal 30a is split before the signal 30a is input into the header 32. The parallel split of the signal 30a is input into a clock noise reduction circuit 48. Upon sensing the rising edge of the clock signal 30a, the clock noise reduction circuit 48 will dump a voltage charge 50 onto the power grid of the system. The dumped charge 50 will alleviate the current noise spike associated with the clock cycle.

Figure 6:
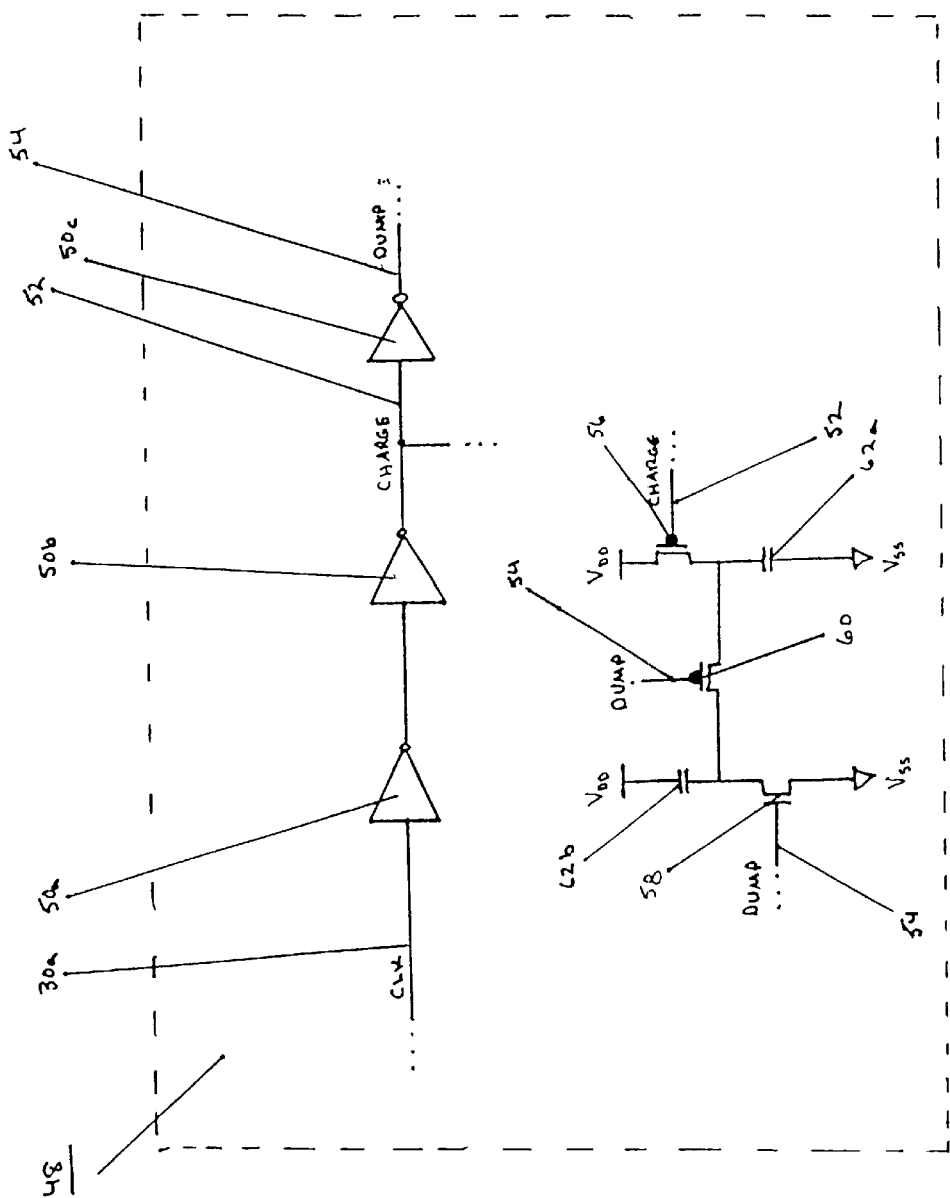
FIG. 6 shows a digital logic schematic of one embodiment of the present invention.

FIG. 6 shows a logic schematic of a clock noise reduction circuit 48 in accordance with one embodiment of the present invention. Once inside the noise reduction circuit 48, the clock signal 30a is input into to a first inverter 50a. This inverter 50a simply inverts the signal value. Next the signal is input to a second inverter 50b which inverts the signal back to its original value. The signal 52 (hereafter referred to as "charge signal") is then split off into two branches. One branch of the charge signal 52 is input into a third inverter 50c which once again inverts the signal. The output of the third inverter 50c (hereafter referred to as "dump signal") is then input, along with the charge signal 52, into three circuit control transistors: a charge control transistor 56; a dump control transistor 58; and a connecting transistor 60. It is important to note that the charge signal 52 and the dump signal 54 will have opposite values because the charge signal passes through the third inverter 50c.

The charge control transistor 56 connects the system power supply (Vdd) with the system ground (Vss) through an charge capacitor 62a. The charge capacitor 62a is located between the charge control transistor 56 and Vss. The transistor 56 is controlled (i.e. switched on and off) with the charge signal 52. The transistor 56 is a "P-type" transistor which means that the transistor is "on" (allows current to pass) when the charge signal 52 is low. Conversely, the transistor 56 is "off" (does not allow current to pass) when the charge signal 52 is high.

The dump control transistor 58 also connects the system power supply (Vdd) with the system ground (Vss) through a dump capacitor 62b. The dump capacitor 62b is located between the dump control transistor 58 and Vdd. The transistor 58 is controlled (i.e. switched on and off) with the dump signal 54. The transistor 58 is an "N-type" transistor which means that the transistor is "on" (allows current to pass) when the dump signal 54 is high. Conversely, the transistor 58 is "off" (does not allow current to pass) when the dump signal 54 is low.

Finally, the connecting transistor 60 connects both sides of the circuit. Specifically, the connecting transistor 60 connects the sides between the control transistors 56, 58 and the respective capacitors 62a, 62b. The connecting transistor 60 is a "P-type" transistor which means that the transistor is "on" (allows current to pass) when the dump signal 54 is low. Conversely, the transistor 60 is "off" (does not allow current to pass) when the dump signal 54 is high.

In normal operation, the control circuit has two phases of operation: a charge phase and a dump phase. In each phase, the circuit is activated by an "active low" signal. This means that the respective control signal (charge 52 or dump 54) initiates its respective phase when it is low rather than high. Specifically, during the charge phase, the charge signal 52 will be low and the dump signal 54 will be high. As a result, the charge control transistor 56 and the dump control transistor 58 are both "on" while the connecting transistor 60 is "off". This allows both capacitors 62a, 62b to charge in preparation for the dump phase. During the dump phase, the charge signal 52 will be high and the dump signal 54 will be low. As a result, the charge control transistor 56 and the dump control transistor 58 are both "off" while the connecting transistor 60 is "on". This allows both capacitors 62a, 62b to dump their charge on the power grid and consequently reduce the peak current draw.

Figure 7B:
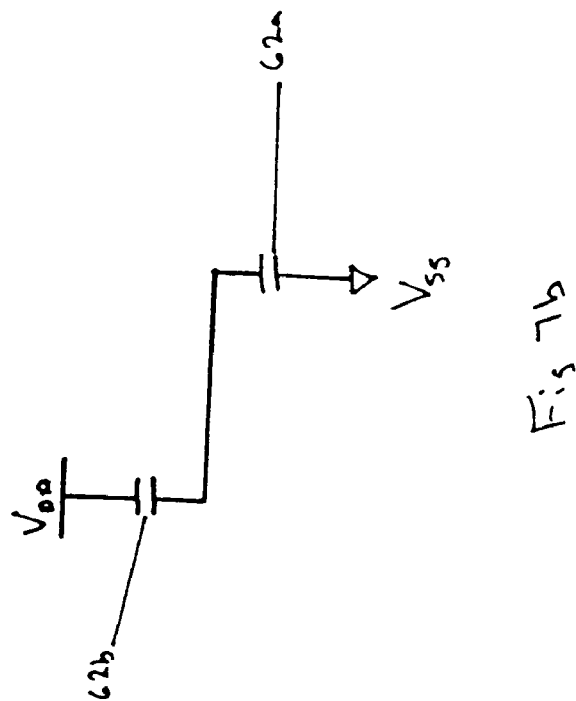
FIG. 7b shows an equivalent circuit of a portion of the digital logic schematic shown in FIG. 6 during a discharge phase.
Figure 7A:
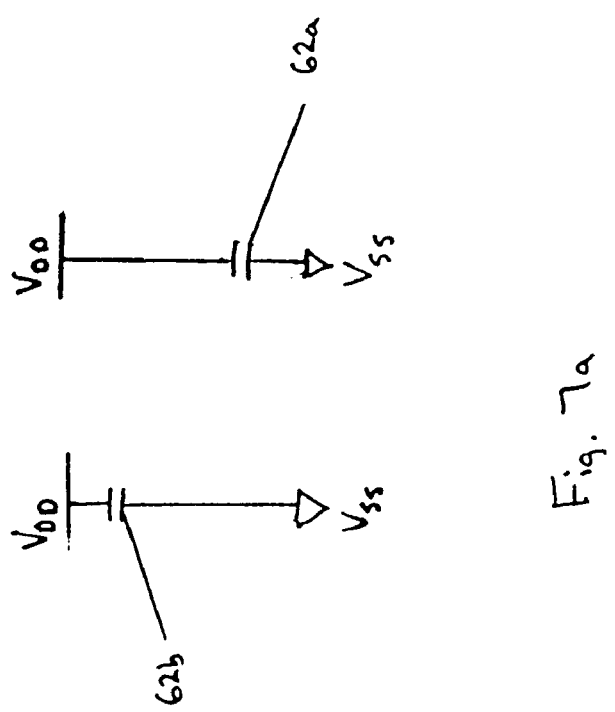
FIG. 7a shows an equivalent circuit of a portion of the digital logic schematic shown in FIG. 6 during a charge phase.

FIGS. 7a and 7b show the equivalent circuits of a portion of the digital logic schematic shown in FIG. 6 during a charge phase and discharge phase respectively. In each figure, the "off" transistors have been deleted while the "on" transistors have been replaced by a standard circuit connection. Specifically, FIG. 7a shows an equivalent circuit during the charge phase. It shows the two capacitors 62a and 62b connected in parallel between Vdd and Vss. FIG. 7b shows an equivalent circuit during the dump phase. It shows the two capacitors 62a and 62b connected in series between Vdd and Vss.

When the capacitors 62a and 62b are in parallel during the charge phase, the each store a charge value "Q", where Q=(Capacitance Value "C")×Vdd. Consequently, the total charge stored by the circuit is 2Q. When the capacitors 62a and 62b are in series during the dump phase, each capacitor 62a and 62b will have a voltage equal to Vdd/2 across it. Consequently, each capacitor will store only Q/2 for a total stored charge of Q by the circuit. The excess charge equal to Q will be dumped onto the power grid.

Figure 3:
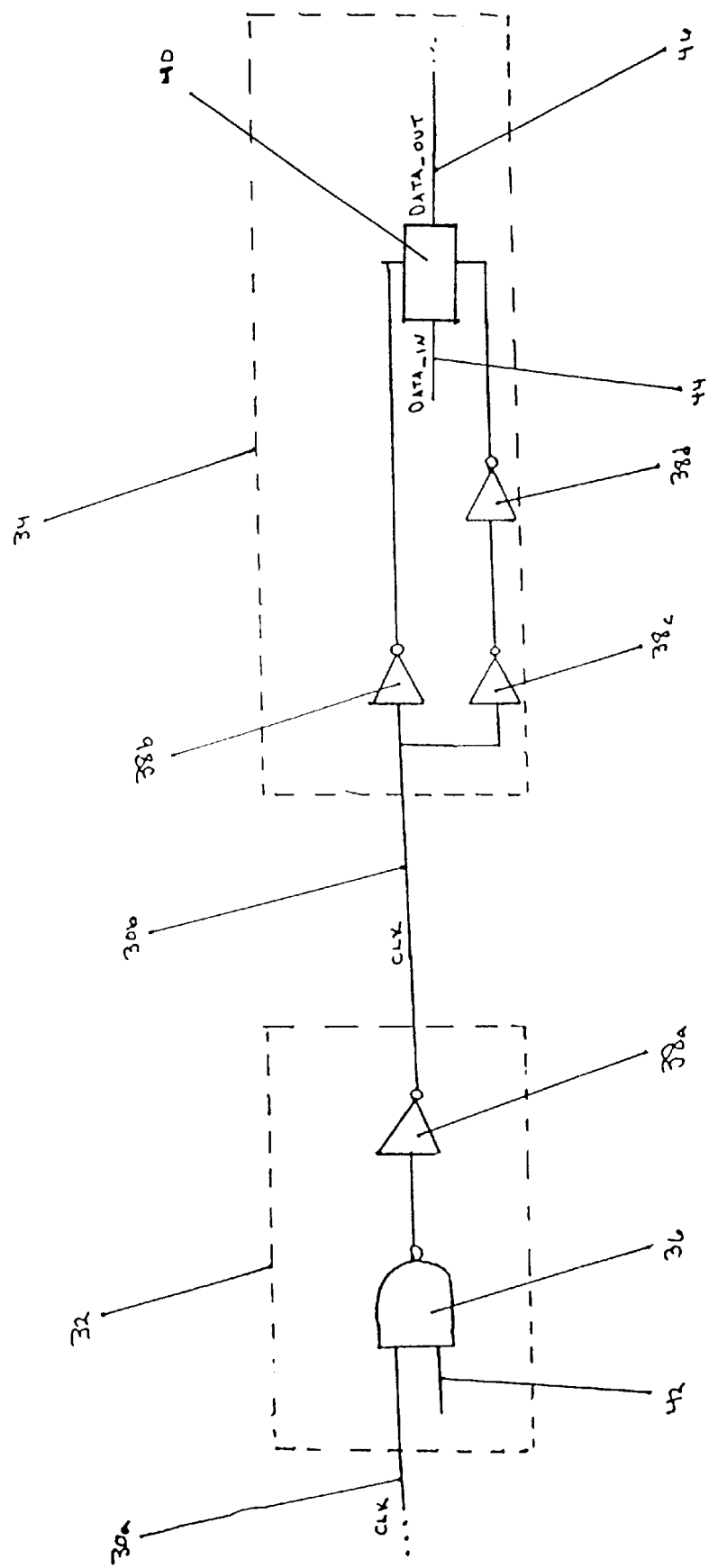
FIG. 3 shows a digital logic schematic of a prior art embodiment of a clocking circuit for a flip-flop.

In comparing FIG. 6 with FIG. 3, it is important to note that the clock header 32 and flip-flop 34 are synchronized with the clock noise reduction circuit 48. The header 32 and flip-flop 34 have a three separate layers of inverters 38a, 38b, 38c, 38d along with the NAND gate 36, while the clock noise reduction circuit 48 has only three inverters 50a, 50b, 50c. In order to synchronize the signals, the components of both paths 38a–d, 36, 50a–c are sized such that the delays of both paths are identical.

The circuit 48 shown in FIG. 6 triggers the dump phase on the falling edge of the clock signal 30a because the dump phase begins when the dump signal 54 is "low" or on the falling edge. However, the circuit could easily be arranged to trigger the dump phase on the falling edge of the clock signal 30a.

Figure 8:
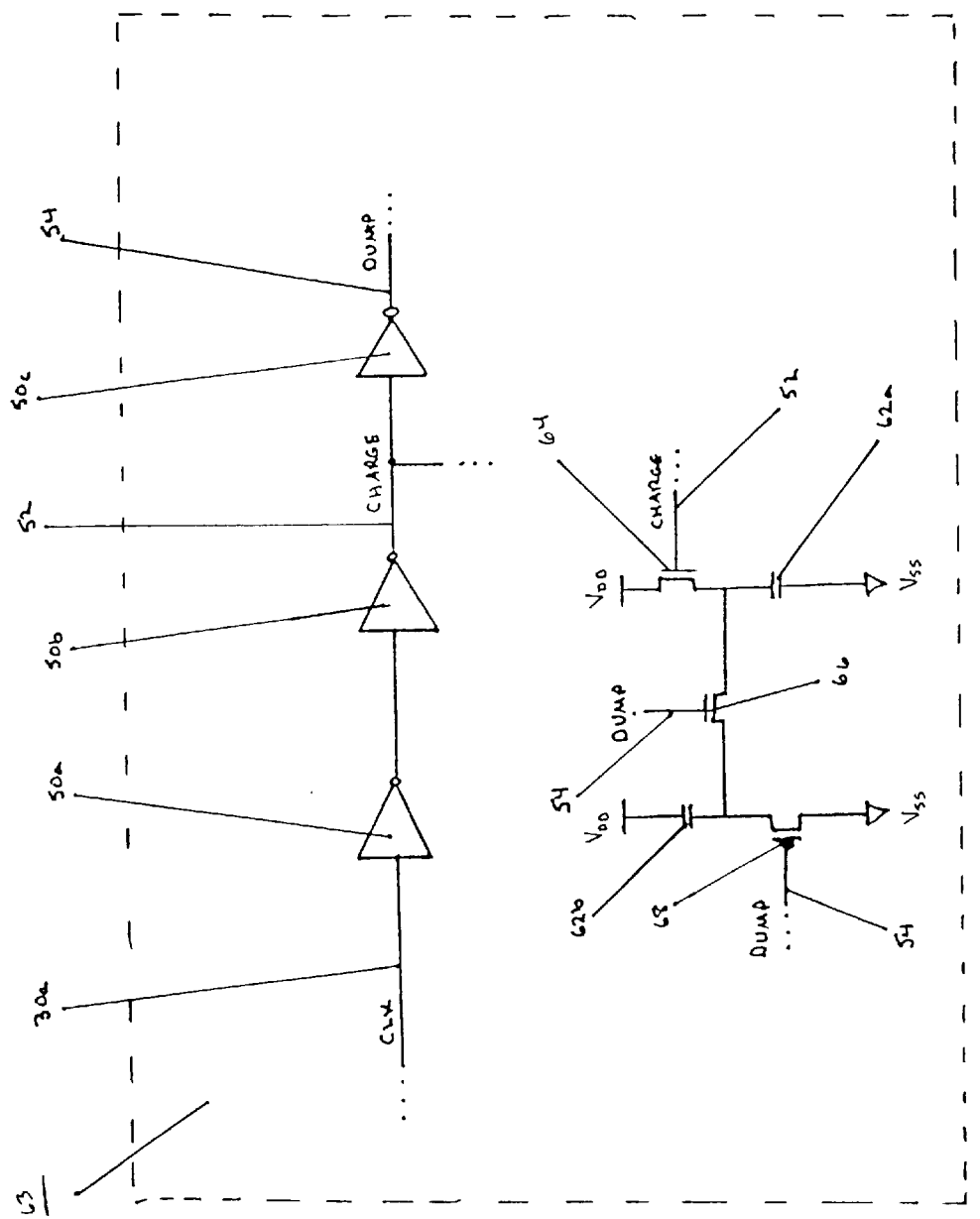
FIG. 8 shows a digital logic schematic of an alternative embodiment of the present invention.

FIG. 8 shows a logic schematic of a clock noise reduction circuit 63 in accordance with one embodiment of a falling edge triggered circuit. The noise reduction circuit 63 is similar to the rising edge triggered circuit 48 (shown in FIG. 6) in that is has the same configuration of three sequential inverters 50a, 50b, 50c that generate the charge signal 52 and the dump signal 54 in the same manner. Additionally, the falling edge circuit 63 has a charge control transistor 64, dump control transistor 68, and a connecting transistor 66. Each is arranged in a similar configuration with respect to Vdd, Vss, and capacitors 62a, 62b, as the rising edge circuit 48.

However, in the falling edge circuit 63, each of the transistors 64, 66, 68 are the opposite type of transistor with respect to the transistors 56, 58, 60 of the rising edge circuit 48. Specifically, the charge control transistor 64 and the connecting transistor 66 are both "N-type" transistors while the dump control transistor 68 is a "P-type" transistor. This means that the charge control transistor 64 is "on" (allows current to pass) when the charge signal 52 is high. Conversely, the transistor 64 is "off" (does not allow current to pass) when the charge signal 52 is low. Additionally, the dump control transistor 68 is "on" (allows current to pass) when the dump signal 54 is low. Conversely, the transistor 68 is "off" (does not allow current to pass) when the dump signal 54 is high. Finally, the connecting transistor 66 is "on" (allows current to pass) when the dump signal 54 is high. Conversely, the connecting transistor 66 is "off" (does not allow current to pass) when the dump signal 54 is low.

The charge phases and dump phases of the falling edge circuit 63 will function in the same manner as the rising edge circuit 48. However, these phases will be triggered by an "active high" control signal (charge 52 or dump 54). During the charge phase the charge signal 52 will be high and the dump signal 54 will be low. As a result, the charge control transistor 64 and the dump control transistor 68 are both "on" while the connecting transistor 66 is "off". This allows both capacitors 62a, 62b to charge in preparation for the dump phase. During the dump phase, the charge signal 52 will be low and the dump signal 54 will be high. As a result, the charge control transistor 64 and the dump control transistor 68 are both "off" while the connecting transistor 66 is "on". This allows both capacitors 62a, 62b to dump their charge on the power grid and consequently reduce the peak current draw. Thus, this circuit 63 will initiate the dump phase on the falling edge of the clock signal 30a because the dump phase begins when the dump signal 54 is "high" or on the rising edge.

Figure 9:
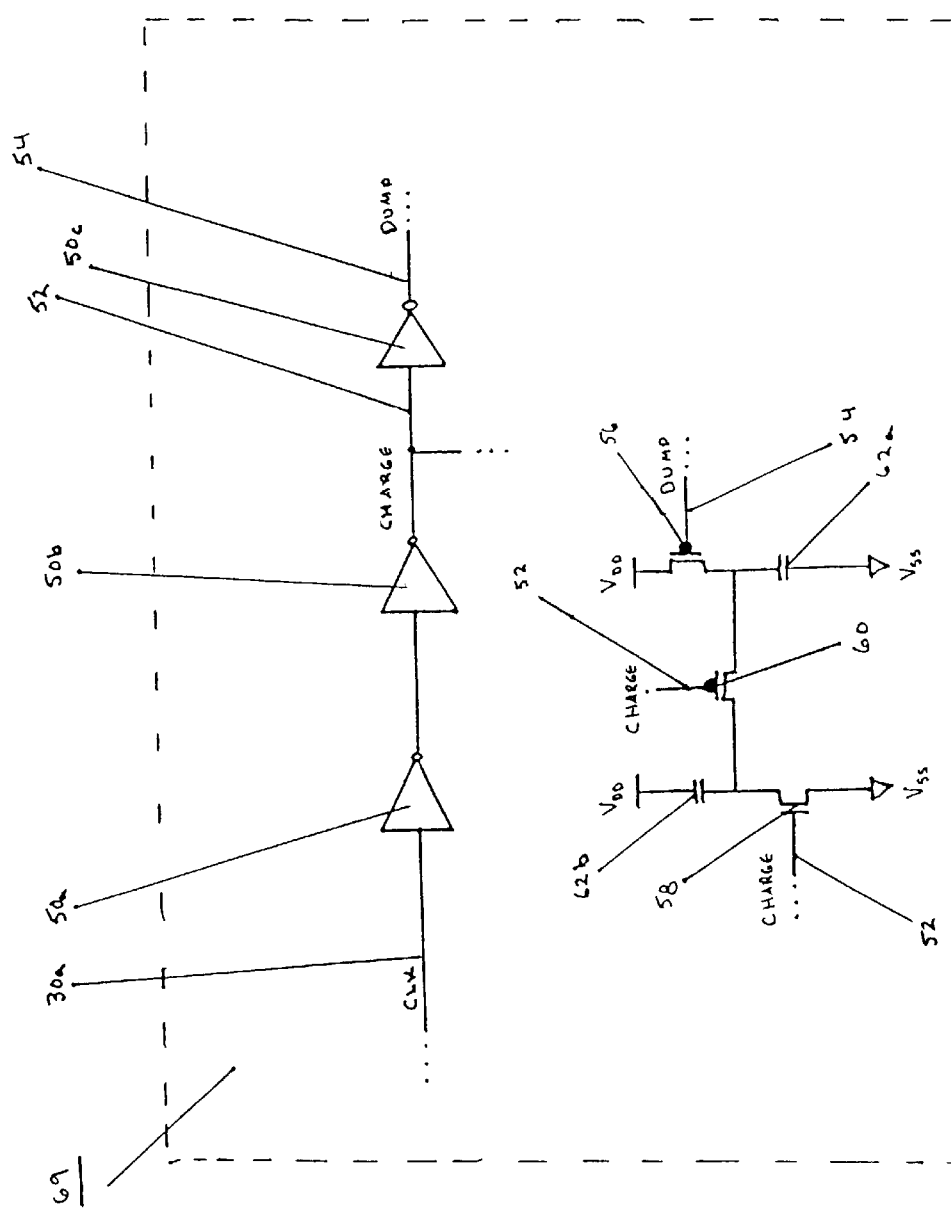
FIG. 9 shows a digital logic schematic of an alternative embodiment of present invention.

FIG. 9 shows a logic schematic of a clock noise reduction circuit 69 in accordance with another embodiment of a falling edge triggered circuit. The noise reduction circuit 69 is similar to the rising edge triggered circuit 48 (shown in FIG. 6) in that is has the same configuration of three sequential inverters 50a, 50b, 50c that generate the charge signal 52 and the dump signal 54 in the same manner. Additionally, the falling edge circuit 69 has a charge control transistor 64, a dump control transistor 68, and a connecting transistor 66. Each is arranged in a similar configuration with respect to Vdd, Vss, and capacitors 62a, 62b, as the rising edge circuit 48.

However, in this embodiment of a falling edge circuit 69, the dump signal 54 and the charge signal 52 are switched as inputs to the control transistors 56 and 58. Specifically, the charge signal 52 is input into the "N-type" control transistor 58 (the dump control transistor of the falling edge circuit 48 shown in FIG. 6) while the dump signal 54 is input into the "P-type" control transistor 56 (the charge control transistor of the falling edge circuit 48 shown in FIG. 6).

The charge phases and dump phases of the falling edge circuit 69 will function in the same manner as the rising edge circuit 48. However, these phases will be triggered by an "active high" control signal (charge 52 or dump 54). During the charge phase the charge signal 52 will be high and the dump signal 54 will be low. As a result, the both control transistors 56 and 58 are "on" while the connecting transistor 60 is "off". This allows both capacitors 62a, 62b to charge in preparation for the dump phase. During the dump phase, the charge signal 52 will be low and the dump signal 54 will be high. As a result, both control transistors 56 and 58 are "off" while the connecting transistor 60 is "on". This allows both capacitors 62a, 62b to dump their charge on the power grid and consequently reduce the peak current draw. Thus, this circuit 69 will initiate the dump phase on the falling edge of the clock signal 30a because the dump phase begins when the dump signal 54 is "high" or on the rising edge.

Figure 4:
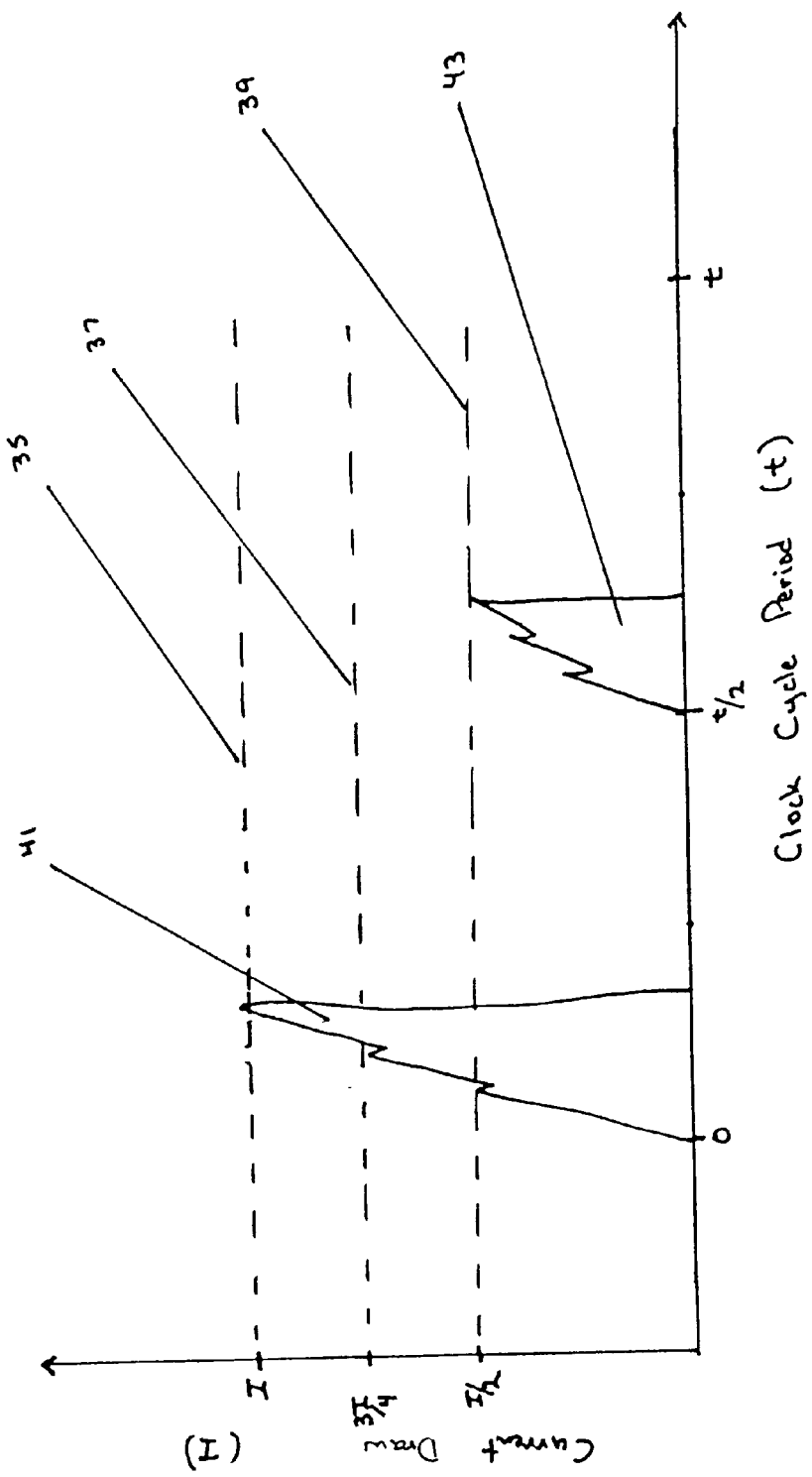
FIG. 4 shows a graph of current draw during a clock cycle period of the prior art embodiment shown in FIG. 3.
Figure 10:
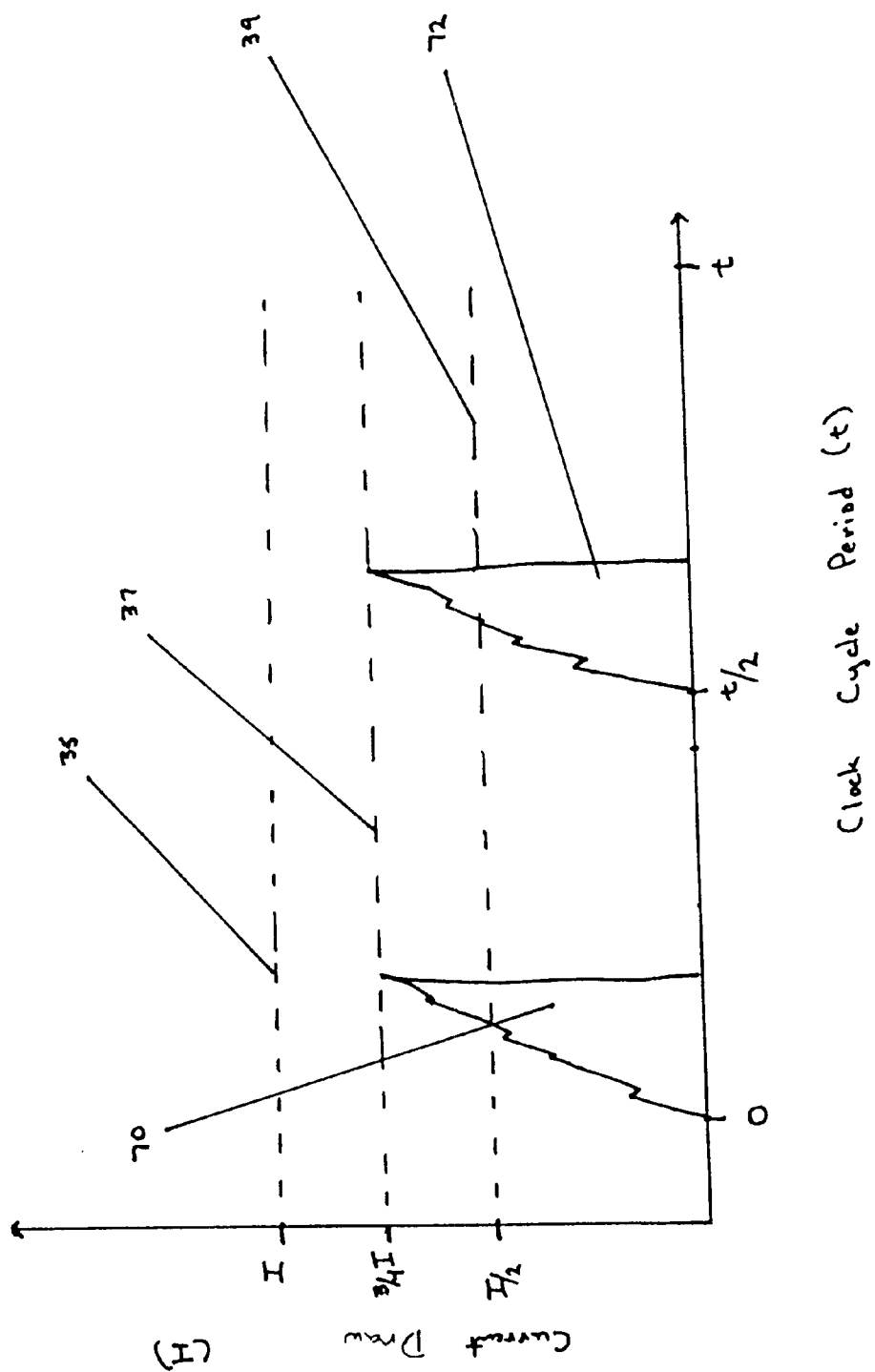
FIG. 10 shows a graph of current draw during a clock cycle period of the embodiments of the present invention shown in FIGS. 6-10.
Figure 1:
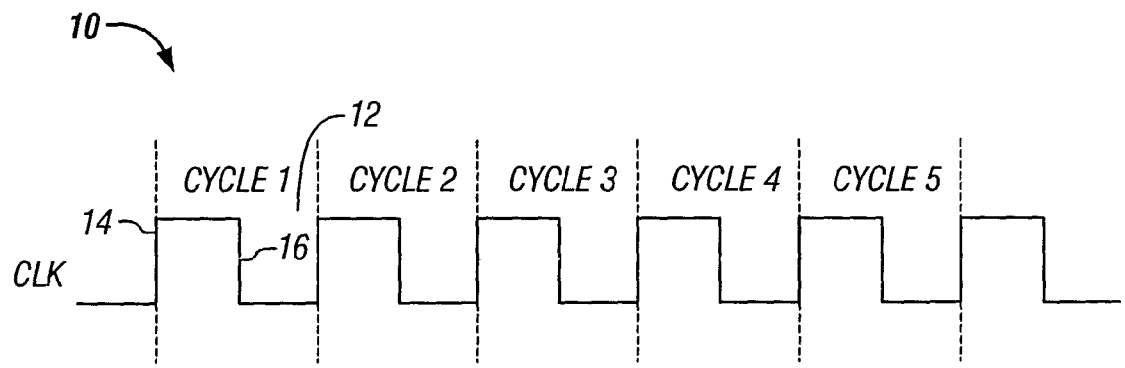
Figure 2:
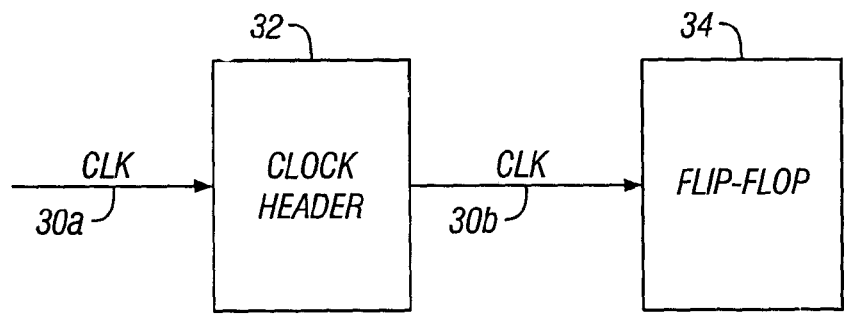
Figure 3:
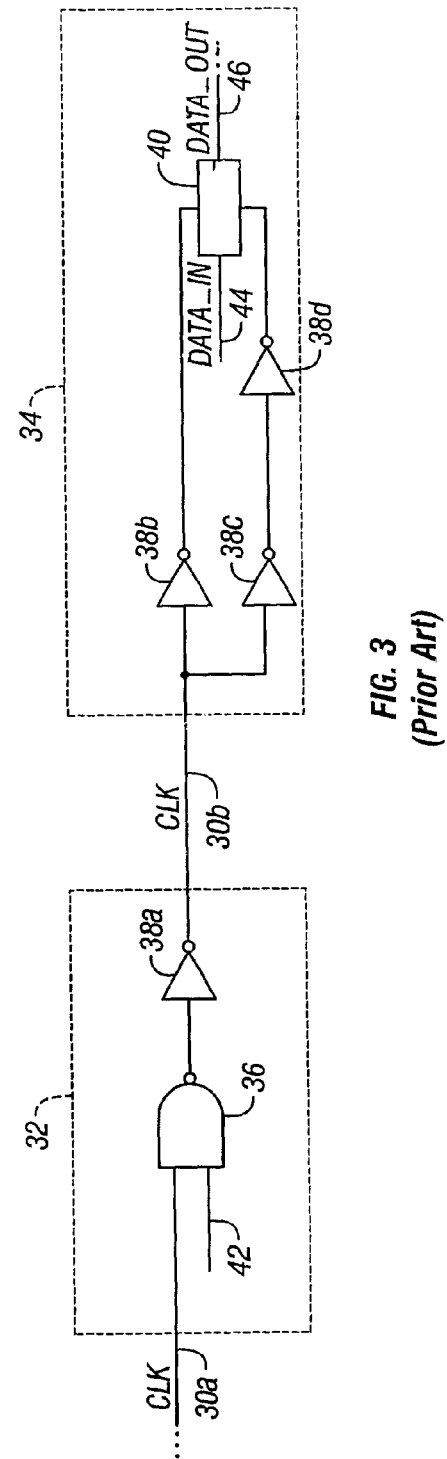
Figure 4:
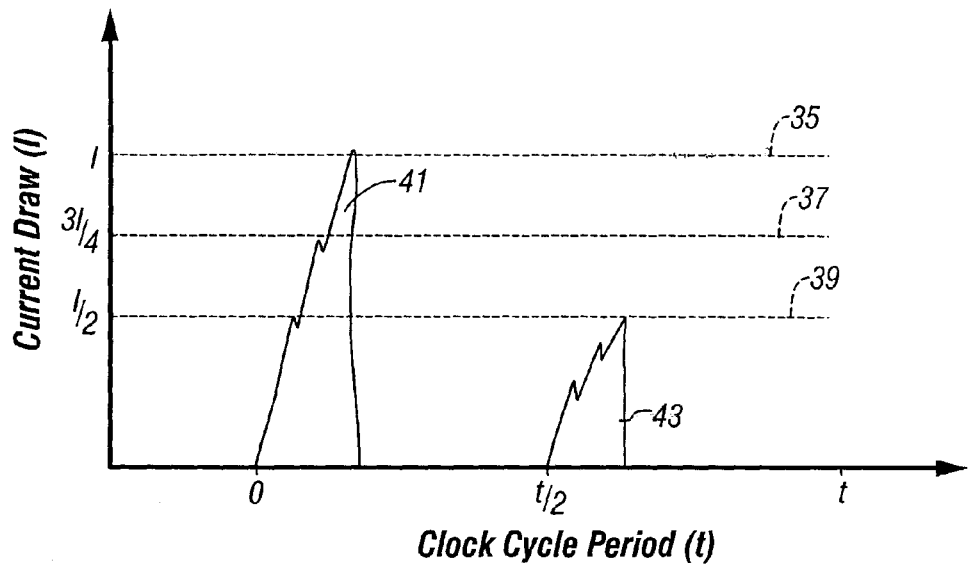

FIG. 10 shows a graph of current draw during a clock cycle period of the rising edge or falling edge noise reduction circuits as shown in FIGS. 6–9. In both circuits, the results in reducing the current draw during the clock signal switching are similar. Specifically, the graph of FIG. 10 is set up on the same scale as the graph of the prior art performance shown in FIG. 4. The value "I" 35 represents the full value of a current draw. The value "¾ I" 37 represents 75% of the full value while the value "½ I" 39 represents 50% of the full value. The first current draw of the graph 70 represents the draw that results from the leading edge of a clock cycle (at clock cycle=0). The second current draw 72 represents the draw that results from the falling edge of the clock cycle (at clock cycle=t/2). As shown, the leading edge draw 70 and the trailing edge draw 72 are both at about 75% (¾ I) 37 of the full current draw. This represents a substantial improvement in noise reduction by reducing the peak current draw while only slightly increasing the companion current draw. These results are consistent for either a falling edge or a rising edge noise reduction circuit. Consequently, such a reduction in the current draw during the switching for a clock signal will reduce the noise generated by the clock signal.

While the invention has been described with respect to a limited number of embodiments, those skilled in the art, having benefit of this disclosure, will appreciate that other embodiments can be devised which do not depart from the scope of the invention as disclosed herein. Accordingly, the scope of the invention should be limited only by the attached claims.

What is claimed is:

1. A method of reducing noise induced by a clock signal in a system having a flip-flop device, comprising:
   inputting the clock signal to a noise reduction circuit;
   storing a charge in the noise reduction circuit upon receiving a first signal from the clock signal; and
   dumping the charge from the noise reduction circuit to a system power grid upon receiving a second signal from the clock signal,
   wherein operation of the noise reduction circuit and operation of the flip-flop device are synchronized.

2. The method of claim 1, wherein the first signal is a rising clock edge.

3. The method of claim 1, wherein the first signal is a falling clock edge.

4. The method of claim 1, wherein the second signal is a rising clock edge.

5. The method of claim 1, wherein the second signal is a falling clock edge.

6. The method of claim 1, wherein storing the charge and dumping the charge occur within the same clock cycle.

7. A method of reducing noise induced by a clock signal in a system having a flip-flop device, comprising:
   a step for inputting the clock signal to a noise reduction circuit;
   a step for storing a charge in the noise reduction circuit upon receiving a first signal from the clock signal; and
   a step for dumping the charge from the noise reduction circuit to a system power grid upon receiving a second signal from the clock signal, wherein operation of the noise reduction circuit and operation of the flip-flop device are synchronized.

8. A method for reducing clock signal induced noise by injecting charge onto a power supply in a system having a flip-flop device, comprising:

inputting the clock signal to a charge injection circuit;

drawing current from the power supply to the flip-flop device upon receiving a first transition on the clock signal; and dumping charge from the charge injection circuit on to the power supply upon receiving the first transition on the clock signal, wherein operation of the charge injection circuit and operation of the flip-flop device are synchronized.

9. The method of claim 8, wherein the flip-flop device is operatively connected to the power supply.

10. The method of claim 8, wherein the first transition is a low to high transition.

11. The method of claim 8, wherein the second transition is a high to low transition.

12. The method of claim 8, further comprising:

storing charge in the charge injection circuit upon receiving a second transition on the clock signal.

13. The method of claim 12, wherein the second transition is a high to low transition.

14. The method of claim 12, wherein the second transition is a low to high transition.

15. The method of claim 8, wherein propagation delay though the charge injection circuit is matched with propagation delay on a path through the flip-flop device.

16. The method of claim 8, wherein the flip-flop device is responsive to the clock signal.

17. The method of claim 8, further comprising:

a clock distribution device responsive to the clock signal, wherein the clock distribution device is operatively connected to the power supply.

18. The method of claim 17, wherein an output of the clock distribution device is operatively connected to an input of the flip-flop device.

* * * * *

UNITED STATES PATENT AND TRADEMARK OFFICE
CERTIFICATE OF CORRECTION

PATENT NO.    : 6,429,722 B1
DATED         : August 6, 2002
INVENTOR(S)   : Brian W. Amick et al.

It is certified that error appears in the above-identified patent and that said Letters Patent is hereby corrected as shown below:

The title page showing an illustrated figure, should be deleted and substituted therefor the attached title page.

Delete drawing sheets 1-10, and substitute therefor the drawing sheets, consisting of drawing sheets 1 - 6, as shown on the attached sheets.

Signed and Sealed this

Seventeenth Day of June, 2003

JAMES E. ROGAN
*Director of the United States Patent and Trademark Office*

(12) United States Patent
Amick et al.

(10) Patent No.: US 6,429,722 B1
(45) Date of Patent: *Aug. 6, 2002

(54) CLOCK NOISE REDUCTION METHOD

(75) Inventors: Brian W. Amick, Sunnyvale; Claude R. Gauthier, Fremont, both of CA (US)

(73) Assignee: Sun Microsystems, Inc., Palo Alto, CA (US)

(*) Notice: Subject to any disclaimer, the term of this patent is extended or adjusted under 35 U.S.C. 154(b) by 0 days.

This patent is subject to a terminal disclaimer.

(21) Appl. No.: 09/846,757

(22) Filed: May 1, 2001

(51) Int. Cl.[7] ................................................ H03K 17/16

(52) U.S. Cl. ..................... 327/379; 327/386; 327/387

(58) Field of Search ................................. 327/379, 384, 327/386, 387, 212, 24, 170

(56) References Cited

U.S. PATENT DOCUMENTS

| | | | | |
|---|---|---|---|---|
| 4,370,620 A | * | 1/1983 | Tin | 329/347 |
| 4,672,325 A | * | 6/1987 | Murai | 327/135 |
| 5,164,611 A | * | 11/1992 | Sumne | 327/170 |
| 5,311,077 A | * | 5/1994 | Brown | 326/21 |
| 5,539,337 A | | 7/1996 | Taylor et al. | 326/94 |
| 5,754,068 A | * | 5/1998 | Kumagai | 327/142 |

* cited by examiner

*Primary Examiner*—Kenneth B. Wells
*Assistant Examiner*—Cassandra Cox
(74) *Attorney, Agent, or Firm*—Rosenthal & Osha L.L.P.

(57) ABSTRACT

A method of reducing the noise of a clock signal distribution system for a flip-flop based circuit has been develop. The method first inputs a synchronized clock signal into a noise reduction circuit. The noise reduction circuit then begins to store charge upon receipt of the clock signal. Finally, the noise reduction circuit dumps the charge onto the system power grid at an appropriate time in conjunction with the clock signal.

18 Claims, 10 Drawing Sheets

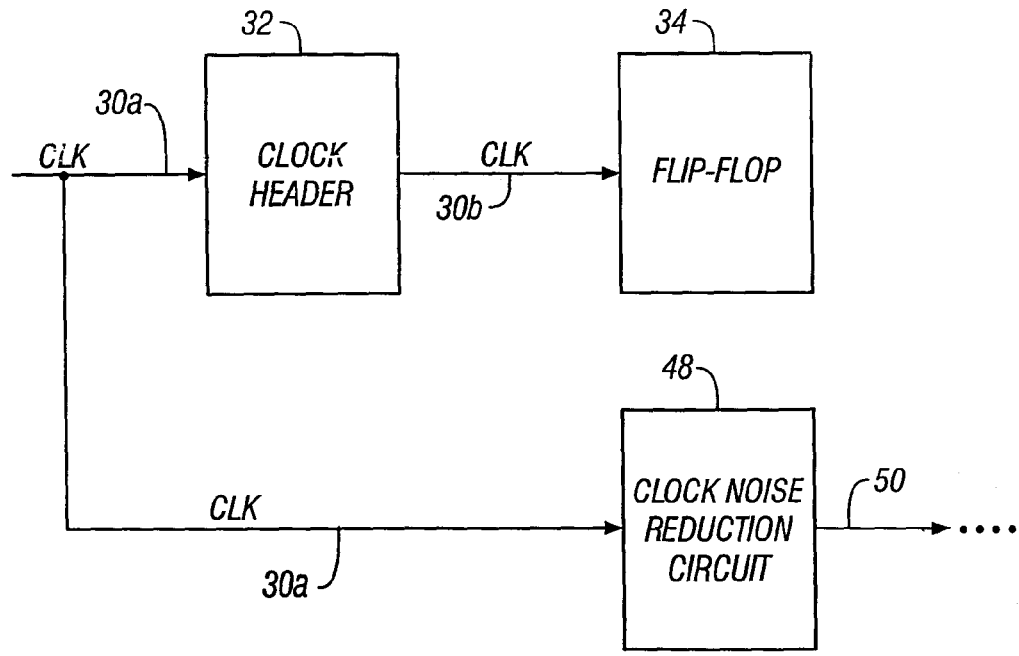

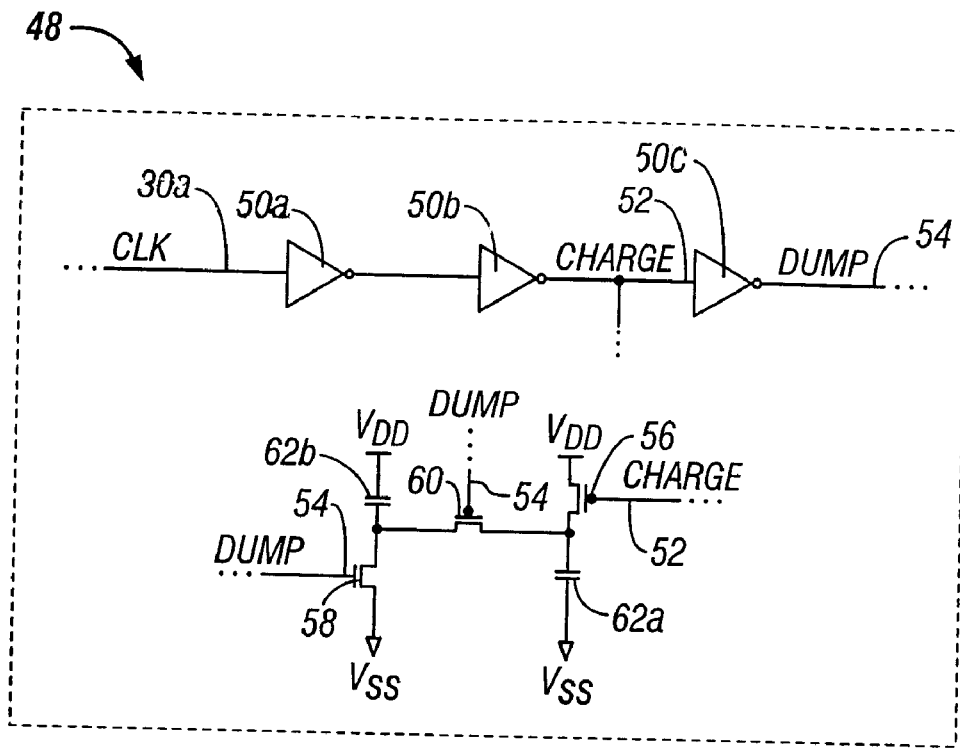
FIG. 6
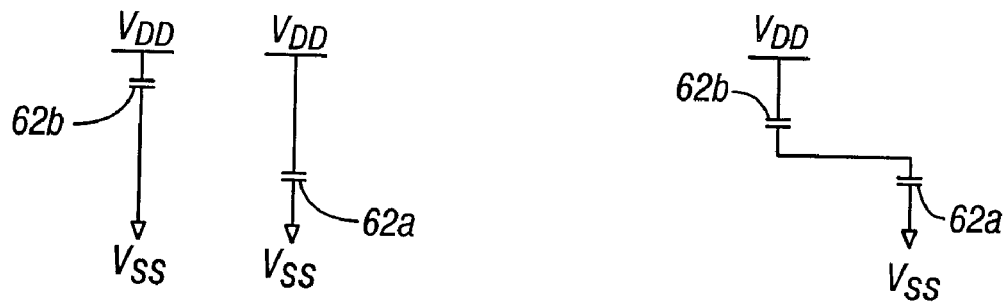
FIG. 7A                                    FIG. 7B